United States Patent [19]

Van Zalinge

[11] Patent Number: 5,963,092
[45] Date of Patent: Oct. 5, 1999

[54] HIGH DYNAMIC RANGE LOW NOISE TRANSCONDUCTANCE AMPLIFIER

[75] Inventor: Klaas Van Zalinge, Meylan, France

[73] Assignee: SGS-Thomson Microelectronics S.A., Saint Genis, France

[21] Appl. No.: 08/980,194

[22] Filed: Nov. 26, 1997

[30] Foreign Application Priority Data

Nov. 29, 1996 [FR] France ................................ 96 14898

[51] Int. Cl.[6] ........................................................ H03F 3/45
[52] U.S. Cl. ............................................ 330/252; 330/260
[58] Field of Search .................................. 330/252, 261, 330/260; 327/359

[56] References Cited

U.S. PATENT DOCUMENTS

| | | | |
|---|---|---|---|
| 4,442,400 | 4/1984 | Nagano | 323/315 |
| 4,460,872 | 7/1984 | Mattisson | 330/252 |
| 5,170,133 | 12/1992 | Pernici | 330/253 |
| 5,465,070 | 11/1995 | Koyama et al. | 330/260 X |
| 5,489,876 | 2/1996 | Pernici | 330/253 |

OTHER PUBLICATIONS

French Search Report from 9614898, filed Nov. 29, 1996.

*Primary Examiner*—Steven J. Mottola
*Attorney, Agent, or Firm*—Wolf, Greenfield & Sacks, P.C.

[57] ABSTRACT

A differential transconductance amplifier includes two first NPN transistors, whose bases receive a differential input voltage, and whose collectors are coupled to a first supply voltage through two respective first current sources; two second NPN transistors respectively coupling the emitters of the first transistors to a second supply voltage, and whose bases are coupled to the collectors of the respective first transistors through level shifters; and a resistive means coupled between the emitters of the first transistors. Each level shifter includes a third PNP transistor coupled between the collector of the respective first transistor and the base of the respective second transistor, and whose control terminal receives a constant bias voltage independent of the differential input voltage.

25 Claims, 2 Drawing Sheets

HIGH DYNAMIC RANGE LOW NOISE TRANSCONDUCTANCE AMPLIFIER

BACKGROUND OF THE INVENTION

1. Field of the Invention

The present invention relates to a differential transconductance amplifier, and more specifically to an accurate transconductance amplifier having all transistors of a same conductivity type.

2. Discussion of the Related Art

FIG. 1 schematically shows a conventional structure of an accurate transconductance amplifier. The amplifier includes a first pair of NPN transistors Q1 and Q2 whose collectors are coupled to a high supply voltage Vcc through respective current sources 10 and 11. The current sources 10 and 11 deliver each a same current I. A resistor R is connected between the emitters of transistors Q1 and Q2. The bases of transistors Q1 and Q2 respectively receive two components V1 and V2 of a differential input voltage.

Two NPN transistors Q3 and Q4 have their emitters connected to a low supply voltage Vee and their collectors respectively connected to the emitters of transistors Q1 and Q2. The bases of transistors Q3 and Q4 are respectively connected to the collectors of transistors Q1 and Q2 through two level shifters 13 and 14. The purpose of these level shifters is to drive the bases of transistors Q3 and Q4 at a suitable voltage from the collectors of transistors Q1 and Q2.

The output of this amplifier is a differential current $i_1-i_2$, where $i_1$ and $i_2$ designate the respective current variations in transistors Q3 and Q4. This differential output current is expressed by $$i_1-i_2=-2(V1-V2)/R$$

with an error of the order of $1/\beta^2$, where $\beta^2$ is the product of the gains of transistors Q1 and Q3 or Q2 and Q4.

The fact that transistors Q1 to Q4 are all NPN transistors increases the accuracy and speed with respect to structures using a combination of NPN and PNP transistors, since PNP transistors have substantially less gain and bandwidth than NPN transistors. A problem encountered in the structure of FIG. 1 is the difficulty in obtaining a high signal-to-noise ratio or high dynamic range. The low limit of the dynamic range is determined by the input noise of the amplifier, while the high limit is ideally determined by the supply voltage Vcc.

The highest possible value of voltages V1 and V2 depends on the structure of level shifters 13 and 14.

For voltages V1 and V2 to be able to reach the lowest possible value, the emitters of transistors Q3 and Q4 are directly connected to the low supply voltage Vee and their currents $i_1$ and $i_2$ are copied into respective NPN transistors Q5 and Q6. Transistors Q5 and Q6 are connected in parallel by their bases and emitters to transistors Q3 and Q4. The output currents $i_1$ and $i_2$ are then taken from the collectors of transistors Q5 and Q6.

With this structure, each of voltages V1 and V2 may reach a value as low as

Vee+Vces+Vbe where Vces is the saturation collector-emitter voltage of transistors Q3 and Q4, and Vbe the base-emitter voltage of transistors Q1 and Q2.

The total noise at the input of the amplifier can be expressed by $$N(V^2/Hz)=4kT(2r_b+r_e+R)+4kTZ_s+2kTZ_s^2/\beta r_e$$

where $r_b$ and $r_e$ are the base and emitter resistances of the input transistors Q1 and Q2, and $Z_s$ is the output impedance of the source which provides voltages V1 and V2.

Further, the base resistance may be expressed by $$r_e=kT/qI_c$$

where $I_c$ is the collector current of the input transistors Q1 and Q2. (k, T, and q are the Boltzmann constant, the absolute temperature, and the charge of an electron, respectively.) This input noise has a minimum value for $$r_e=Z_s/\beta$$

or $I_c=kT/qZ_s$ which determines the optimum value of the collector currents of transistors Q1 and Q2, thus the optimum value Iopt of the currents provided by the sources 10 and 11.

The differential output current $i_1-i_2$ may reach a maximum value of 2I. However, to avoid distortion, value 2I is chosen larger than the maximum desired value for $i_1-i_2$. In many cases, especially when impedance $Z_s$ is high, it will not be possible to choose a value 2I which ensures both optimal input noise characteristics and a distortion-free maximum output signal.

FIGS. 2A and 2B both illustrate one half of the transconductance amplifier of FIG. 1, with two different examples of a level shifter 13.

In FIG. 2A, the level shifter 13 includes a PNP transistor Q7 whose base is connected to the base of transistor Q1. The emitter of transistor Q7 is connected to the collector of transistor Q1 and its collector is connected to the base of transistor Q3.

With this structure, the voltage at the collector of transistor Q1 is fixed to V1+Vbe, where Vbe is the base-emitter voltage of transistor Q7. Therefore, voltage V1 may not exceed the value Vcc−Vsat−Vbe, where Vsat is the saturation voltage of current source 10 (usually a transistor). Transistor Q7 has the drawback of adding significant input noise to the amplifier, since the base of transistor Q7 is connected to the input of the amplifier.

FIG. 2B shows an example of a level shifter 13 which does not add input noise to the amplifier. Level shifter 13 includes an NPN transistor Q8 whose base is connected to the collector of transistor Q1. The collector of transistor Q8 is coupled to voltage Vcc, and its emitter is coupled to the base of transistor Q3.

With this structure, voltage V1 may however not exceed value Vee+3Vbe−Vces, where Vces is the saturation collector-emitter voltage of transistor Q1. This value could be increased by inserting diodes between the emitter of transistor Q8 and the base of transistor Q3, but the supply voltage of the amplifier should then remain relatively high.

SUMMARY OF THE INVENTION

An object of the present invention is to provide an accurate transconductance amplifier having a high dynamic range.

This and other objects are achieved by a differential transconductance amplifier comprising two first bipolar transistors of a first conductivity type, whose bases receive a differential input voltage, and whose collectors are coupled to a first supply voltage through two respective first current sources; two second bipolar transistors of the first conductivity type, respectively coupling the emitters of the first transistors to a second supply voltage, and whose bases are coupled to the collectors of the respective first transistors through level shifters; and a resistive means coupled between the emitters of the first transistors. A second current source is coupled between the first supply voltage and the connection node between two series connected resistors forming the resistive means.

This and other objects are also achieved by a differential transconductance amplifier comprising two first bipolar transistors of a first conductivity type, whose bases receive a differential input voltage, and whose collectors are coupled to a first supply voltage through two respective first current sources; two second bipolar transistors of the first conductivity type, respectively coupling the emitters of the first transistors to a second supply voltage, and whose bases are coupled to the collectors of the respective first transistors through level shifters; and a resistive means coupled between the emitters of the first transistors. Each level shifter comprises a third transistor of a second conductivity type, coupled between the collector of the respective first transistor and the base of the respective second transistor, and whose control terminal receives a constant bias voltage independent of the differential input voltage.

According to an embodiment of the invention, the bias voltage is chosen offset from the first supply voltage of a value substantially equal to the saturation voltage of the respective first current source, plus the voltage drop between the control terminal of the third transistor and the collector of the respective first transistor.

According to an embodiment of the invention, the first conductivity type is N.

BRIEF DESCRIPTION OF THE DRAWINGS

The foregoing and other objects, features, aspects and advantages of the invention will become apparent from the following detailed description of embodiments, given by way of illustration and not of limitation with reference to the accompanying drawings, among which.

DETAILED DESCRIPTION

Figure 1:
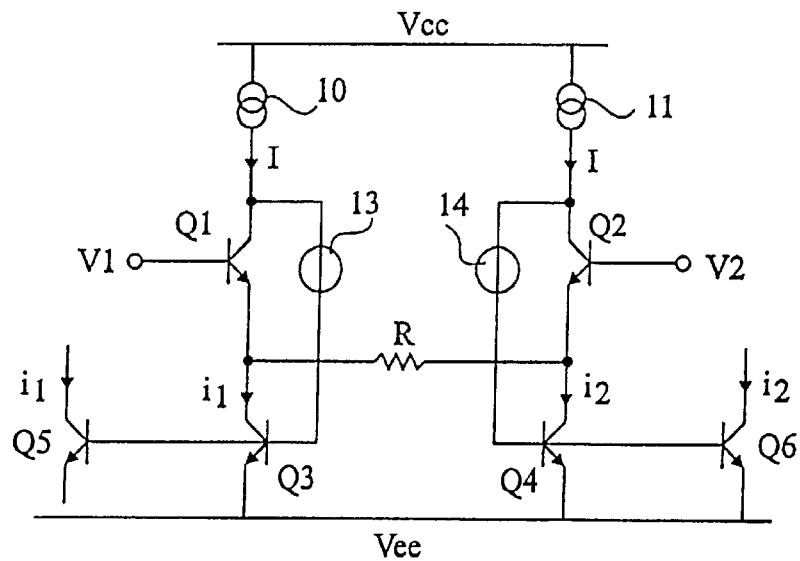
FIG. 1, previously described, shows a conventional all NPN accurate transconductance amplifier.
Figure 3:
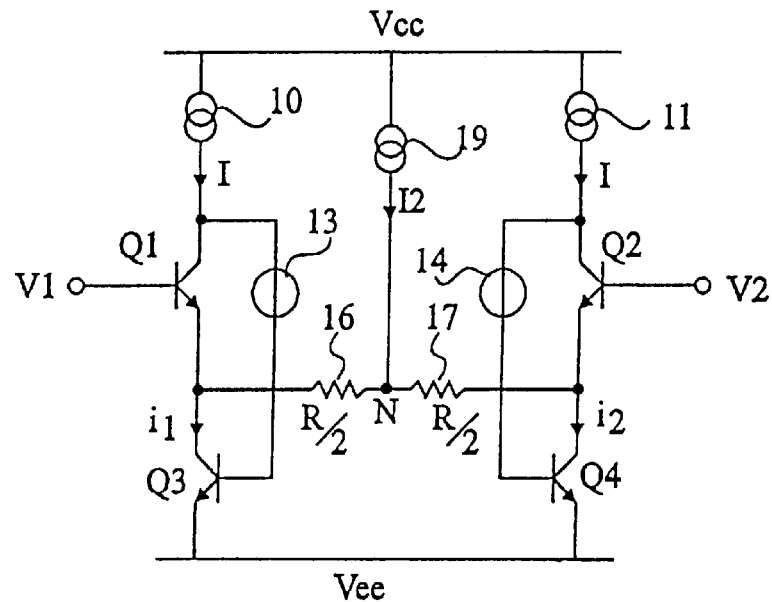
FIG. 3 shows an embodiment of a transconductance amplifier according to the invention.

In FIG. 3, the same elements as in FIG. 1 are designated with the same reference characters. According to the invention, resistor R of FIG. 1 is replaced, in FIG. 3, with two resistors 16, 17 connected in series between the emitters of transistors Q1 and Q2. Resistors 16 and 17 preferably have a same value R/2. The connection node N between resistors 16 and 17 is coupled to the high supply voltage Vcc through a current source 19 providing a current I2.

In operation, when voltages V1 and V2 are equal, current I2 is equally split between resistors 16 and 17, whereby each of the output currents $i_1$ and $i_2$ is equal to I+I2/2. The voltage at node N is then higher than the emitter voltages of transistors Q1 and Q2.

When voltage V1 increases relative to voltage V2, the current in resistor 16 decreases while the current in resistor 17 increases, up to the extent where no current flows in resistor 16 and all current I2 flows in resistor 17. Then, the output current $i_1$ is equal to I and the output current $i_2$ is equal to I+I2.

If voltage V1 still increases, part of the current I provided by source 10 starts flowing in resistor 16 towards node N. When voltage V1 reaches a maximum value, all the current I from source 10 flows in resistor 16, whereby output current $i_1$ is zero and output current $i_2$ is equal to 2I+I2.

Thus, the differential output current $i_1-i_2$ has a maximum value of 2I+I2 which is determined both by current sources 10 and 11 and by current source 19. Current I delivered by sources 10 and 11 may be chosen at an optimum value for reducing the input noise. Since the current I2 provided by source 19 has no influence on the currents in the input transistors Q1 and Q2, it does not affect the input noise and may thus be chosen freely for setting the maximum differential output current.

Provided that each of resistors 16 and 17 has half the value of resistor R of FIG. 1, the differential output current has the same expression as that of FIG. 1, i.e.:

$$i_1-i_2=-2(V1-V2)/R.$$

The embodiment of FIG. 3 allows for increasing the dynamic range of the transconductance amplifier by reducing its input noise.

Figure 4:
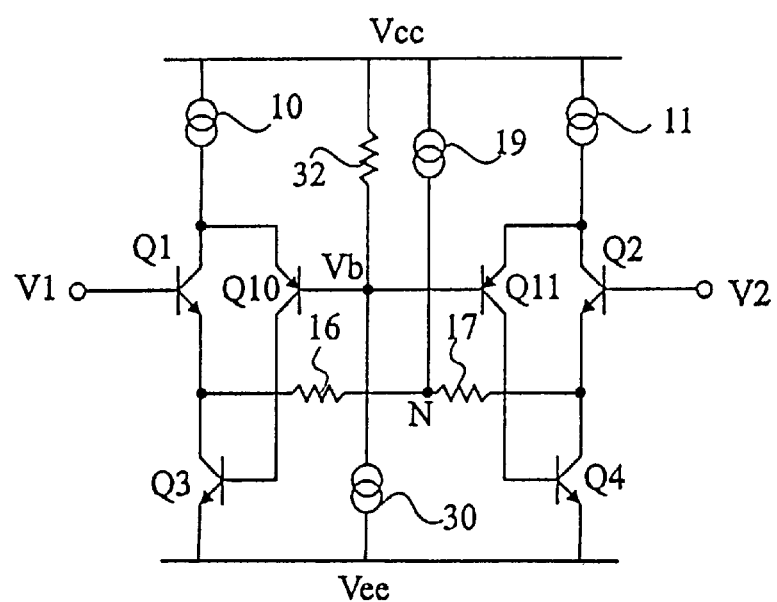
FIG. 4 shows a second embodiment of a transconductance amplifier according to the invention, combined with the embodiment of FIG. 3.

FIG. 4 shows an embodiment of the invention that allows for increasing the dynamic range of the amplifier by increasing the maximum amplitude of input voltages V1 and V2 without increasing the input noise.

For this purpose, each of level shifters 13 and 14 includes a P-type transistor Q10, Q11. These P-type transistors may be PNP transistors, as shown. In BI-CMOS technology, transistors Q10 and Q11 could also be P-channel MOS transistors.

The emitters of transistors Q10 and Q11 are respectively connected to the collectors of transistors Q1 and Q2, and their collectors are respectively connected to the bases of transistors Q3 and Q4. The bases of transistors Q10 and Q11 receive a same bias voltage Vb.

Bias voltage Vb determines the maximum value of voltages V1 and V2, this maximum value being $$Vb+2Vbe-Vces$$

where Vces is the saturation collector-emitter voltage of transistors Q1 and Q2. Preferably, voltage Vb is chosen as high as possible for increasing the maximum value of voltages V1 and V2, and thus the dynamic range. The highest possible value of voltage Vb is $$Vcc-Vbe-Vsat$$

where Vsat is the saturation voltage of current sources 10 and 11 (usually transistors). Then, the maximum value of voltages V1 and V2 is $$Vcc+Vbe-Vces-Vsat.$$

Figure 2A:
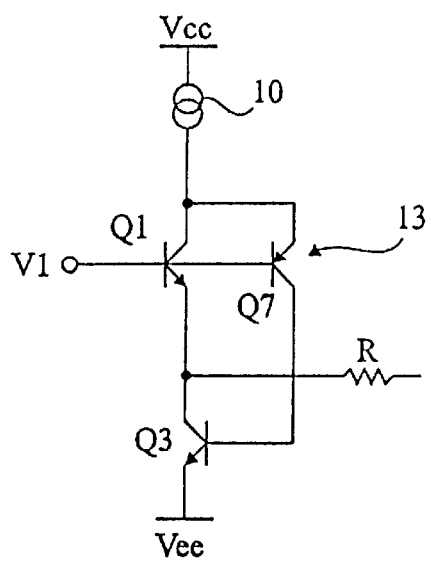
FIGS. 2A and 2B, previously described, show two different examples of a level shifter usable in the circuit of FIG. 1.
Figure 2B:
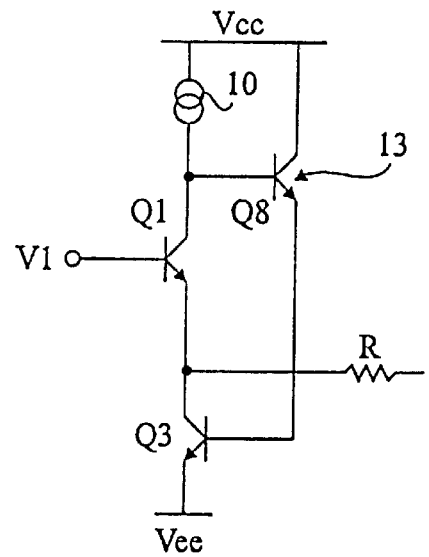

Voltages Vces and Vsat are substantially equal and usually less than Vbe/2, whereby voltages V1 and V2 may reach a value slightly above Vcc. This gain (Vbe+Vsat) in maximum amplitude with respect to the level shifter shown in FIG. 2A is all the more significant that the supply voltage of the amplifier is low.

Voltage Vb is obtained, for example, by connecting the bases of transistors Q10 and Q11 to voltage Vee through a current source 30 and to voltage Vcc through a resistor 32.

The values of current source 30 and of resistor 32 are chosen to obtain the desired voltage Vbe+Vsat across resistor 32. This desired voltage is obtained independently of the supply voltage Vcc, which may be as low as Vbe+2Vsat.

In FIG. 4, the advantageous level shifters Q10 and Q11 are shown combined with the embodiment of FIG. 3. The embodiment of FIG. 4 thus increases the dynamic range both by reducing the input noise level and increasing the maximum amplitude of the differential input signal.

Many alternatives and modifications of the present invention will appear to those skilled in the art. For example, transistors Q1 to Q4 have been described as NPN transistors, because the amplifier then has the best accuracy and speed. The transistors may be replaced by transistors of opposite conductivity type, which may affect the accuracy and speed, but not the dynamic range. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A differential transconductance amplifier comprising:
   two first bipolar transistors of a first conductivity type, having bases that receive a differential input voltage, and having collectors that are coupled to a first supply voltage through two respective first current sources;
   two second bipolar transistors of the first conductivity type, respectively coupling the emitters of the first transistors to a second supply voltage, and whose bases are coupled to the collectors of the respective first transistors through level shifters; and
   a resistive means coupled between the emitters of the first transistors;
   wherein each level shifter comprises a third transistor of a second conductivity type, coupled between the collector of the respective first transistor and the base of the respective second transistor, and having a control terminal that receives a constant bias voltage independent of the differential input voltage.

2. The amplifier according to claim 1, further comprising a second current source coupled between the first supply voltage and the connection node between two series connected resistors forming the resistive means.

3. The amplifier according to claim 2, the bias voltage is chosen offset from the first supply voltage of a value substantially equal to a saturation voltage of the respective first current source, plus a voltage drop between the control terminal of the third transistor and the collector of the respective first transistor.

4. The amplifier according to claim 1, wherein the first conductivity type is NPN.

5. The amplifier according to claim 1 wherein the two first bipolar transistors are each NPN transistors.

6. The amplifier according to claim 5 wherein the two second bipolar transistors are each NPN transistors.

7. The amplifier according to claim 6 wherein the third transistor is a PNP transistor.

8. A differential transconductance amplifier comprising:
   two first bipolar transistors of a first conductivity type, having bases that receive a differential input voltage, and having collectors that are coupled to a first supply voltage through two respective first current sources;
   two second bipolar transistors of the first conductivity type, respectively coupling the emitters of the first transistors to a second supply voltage, and whose bases are coupled to the collectors of the respective first transistors through level shifters;
   a pair of series connected resistors forming a resistive means and having a node defined therebetween; and
   a second current source coupled between the first supply voltage and the resistive means node.

9. The amplifier according to claim 8 wherein each level shifter comprises a third transistor of a second conductivity type, coupled between the collector of the respective first transistor and the base of the respective second transistor, and having a control terminal that receives a constant bias voltage independent of the differential input voltage.

10. The amplifier according to claim 9 wherein the bias voltage is chosen offset from the first supply voltage of a value substantially equal to a saturation voltage of the respective first current source, plus a voltage drop between the control terminal of the third transistor and the collector of the respective first transistor.

11. The amplifier according to claim 9 wherein the two first bipolar transistors are each NPN transistors.

12. The amplifier according to claim 11 wherein the two second bipolar transistors are each NPN transistors.

13. The amplifier according to claim 12 wherein the third transistor is a PNP transistor.

14. A differential amplifier comprising:
   two first bipolar transistors of a first conductivity type, having bases that receive a differential input voltage;
   a first supply voltage;
   two first current sources connected from the first supply voltage to respect collectors of the two first bipolar transistors;
   two second bipolar transistor of the first conductivity type;
   a second supply voltage;
   two level shifters;
   said second bipolar transistors respectively coupling the emitters of the first transistors to said second supply voltage, and whose bases are coupled to the collectors of the respective first transistors through said level shifters; and
   a resistive means coupled between the emitters of the first transistors;
   wherein each level shifter comprises a third transistor of a second conductivity type, coupled between the collector of the respective first transistor and the base of the respective second transistor, and having a control terminal that receives a constant bias voltage independent of the differential input voltage.

15. The amplifier according to claim 14 further comprising a second current source coupled between the first supply voltage and the connection node between two series connected resistors forming the resistive means.

16. The amplifier according to claim 15, the bias voltage is chosen offset from the first supply voltage of a value substantially equal to a saturation voltage of the respective first current source, plus a voltage drop between the control terminal of the third transistor and the collector of the respective first transistor.

17. The amplifier according to claim 14, wherein the first conductivity type is NPN.

18. A differential amplifier comprising:

two first bipolar transistors of a first conductivity type, having bases that receive a differential input voltage;

a first supply voltage;

two first current sources connected from the first supply voltage to respect collectors of the two first bipolar transistors;

two second bipolar transistor of the first conductivity type;

a second supply voltage;

two level shifters;

said second bipolar transistors respectively coupling the emitters of the first transistors to said second supply voltage, and whose bases are coupled to the collectors of the respective first transistors through said level shifters; and a pair of series connected resistors forming a resistive means and having a node defined therebetween; and a second current source coupled between the first supply voltage and the resistive means node.

19. The amplifier according to claim 18 wherein each level shifter comprises a third transistor of a second conductivity type, coupled between the collector of the respective first transistor and the base of the respective second transistor, and having a control terminal that receives a constant bias voltage independent of the differential input voltage.

20. The amplifier according to claim 19 wherein the bias voltage is chosen offset from the first supply voltage of a value substantially equal to a saturation voltage of the respective first current source, plus a voltage drop between the control terminal of the third transistor and the collector of the respective first transistor.

21. A differential amplifier comprising:

two first bipolar transistors of a first conductivity type, having bases that receive a differential input voltage;

a first supply voltage means;

two first current source means;

means for connecting the collectors of said two first bipolar transistors to the first supply voltage through said two respective first current sources;

two second bipolar transistors of the first conductivity type;

a second supply voltage means;

two first level shifter means;

said two second bipolar transistors including means for respectively coupling the emitters of the first transistor to said second supply voltage and for coupling the bases to the collectors of the respective first transistors through said level shifter means;

a resistive means coupled between the emitters of the first transistors;

wherein each level shifter means comprises a third transistor of a second conductivity type, coupled between the collector of the respective first transistor and the base of the respective second transistor, and having a control terminal that receives a constant bias voltage independent of the differential input voltage.

22. The amplifier according to claim 21 further comprising a second current source means coupled between the first supply voltage means and the connection node between two series connected resistors forming the resistive means.

23. The amplifier according to claim 22 wherein the bias voltage is chosen offset from the first supply voltage of a value substantially equal to a saturation voltage of the respective first current source, plus a voltage drop between the control terminal of the third transistor and the collector of the respective first transistor.

24. A differential amplifier comprising:

two first bipolar transistors of a first conductivity type, having bases that receive a differential input voltage;

a first supply voltage means;

two first current source means;

means for connecting the collectors of said two first bipolar transistors to the first supply voltage through said two respective first current sources;

two second bipolar transistors of the first conductivity type;

a second supply voltage means;

two first level shifter means;

said two second bipolar transistors including means for respectively coupling the emitters of the first transistor to said second supply voltage and for coupling the bases to the collectors of the respective first transistors through said level shifter means;

a pair of series connected resistors forming a resistive means and having a node defined therebetween; and a second current source means coupled between the first supply voltage means and the resistive means node.

25. The amplifier according to claim 24 wherein each level shifter means comprises a third transistor of a second conductivity type, coupled between the collector of the respective first transistor and the base of the respective transistor, and having a control terminal that receives a constant bias voltage independent of the differential input voltage.

* * * * *